US005656330A

United States Patent [19]

Niiyama et al.

[11] Patent Number: 5,656,330

[45] Date of Patent: Aug. 12, 1997

[54] RESISTIVE ELEMENT HAVING A RESISTIVITY WHICH IS THERMALLY STABLE AGAINST HEAT TREATMENT, AND METHOD AND APPARATUS FOR PRODUCING SAME

[75] Inventors: Takahiro Niiyama; Shigeo Itoh; Teruo Watanabe, all of Mobara, Japan

[73] Assignee: Futaba Denshi Kogyo K.K., Mobara, Japan

[21] Appl. No.: 408,566

[22] Filed: Mar. 22, 1995

[30] Foreign Application Priority Data

Mar. 22, 1994 [JP] Japan .................................... 6-050594

[51] Int. Cl.$^6$ .............................. C23C 16/22; H01J 9/04

[52] U.S. Cl. ......................... 427/255.2; 427/77; 427/101; 445/50; 445/51; 438/20; 438/384

[58] Field of Search .................................... 427/578, 579, 427/101, 255.2, 77, 78; 437/101, 228; 445/50, 51

[56] References Cited

U.S. PATENT DOCUMENTS 4,668,599 5/1987 Yamazaki et al. ........................ 430/84

*Primary Examiner*—Shrive Beck
*Assistant Examiner*—Timothy H. Meeks
*Attorney, Agent, or Firm*—Oblon, Spivak, McClelland, Maier & Neustadt, P.C.

[57] ABSTRACT

A resistive element is provided which is used on a cathode conductor side of a field emission type fluorescent display device and made of a hydrogenated amorphous silicon film. Nitride is added during deposition of the hydrogenated amorphous silicon film containing an impurity for controlling resistivity of the film. A method for producing the resistive element and an apparatus therefor are also disclosed.

14 Claims, 4 Drawing Sheets

RESISTIVE ELEMENT HAVING A RESISTIVITY WHICH IS THERMALLY STABLE AGAINST HEAT TREATMENT, AND METHOD AND APPARATUS FOR PRODUCING SAME

BACKGROUND OF THE INVENTION

This invention relates to a resistive element and a method and an apparatus for producing the same, and more particularly to a resistive element which is made of a hydrogenated amorphous silicon (a-Si:H) film containing an impurity for controlling resistivity of the film and of which resistivity is maintained stable against a heat treatment and a method and an apparatus for producing such a resistive element.

In general, a hydrogenated amorphous silicon film which contains an impurity for controlling resistivity of the film has been conventionally produced by plasma chemical vapor deposition (hereinafter also referred to as "plasma CVD"), reactive sputtering or the like.

For example, formation of a hydrogenated amorphous silicon film of the n-type by plasma CVD is carried out by subjecting a starting gas material consisting of mono-silane ($SiH_4$) or a mixture of higher silane and phosphine to radiofrequency (RF) discharge, resulting in being decomposed, followed by deposition of the decomposed gas on a substrate kept at a temperature of about 200° to 300° C.

The hydrogenated amorphous silicon film thus formed which contains the impurity for controlling resistivity of the film contains a hydrogen component at a level of about 10 to 20 atm %. The hydrogen component contained significantly affects properties of the hydrogenated amorphous silicon film.

Also, the hydrogen component contained in the hydrogenated amorphous silicon film not only performs a direct function of removing a dangling bond during deposition of the film but plays a part in a surface process during formation of the film and acts as a structure relaxing agent for a network. Such parts of the hydrogen component synergistically act on each other and cooperate with a thermal effect due to a temperature of the substrate, so that the above-described dangling bond may be significantly reduced.

More particularly, the hydrogenated amorphous silicon film has a Si—H bond, which acts to reduce an unstable dangling bond to provide a structural sharpness during formation of the hydrogenated amorphous silicon film and permits P (phosphor belonging to Group V of the periodic table) and B (boron belonging to Group III of the periodic table) to realize a p-n junction due to substitutional doping as in crystalline Si. Such properties of the hydrogen component in the hydrogenated amorphous silicon film is highly important in that they permit the hydrogenated amorphous silicon film to be applied to a diode, a transistor and the like.

Heating of the hydrogenated amorphous silicon film produced as described above which contains the impurity for controlling resistivity of the film causes hydrogen to generally start to be released from the film at a temperature within a range of between 250° C. and 350° C. Such diffusion of hydrogen indicates release of H from the Si—H Bond, resulting in the above-described dangling bond and other abnormal electron arrangement such as floating bond or the like and therefore structural defects occurring during deposition of the hydrogenated amorphous silicon film.

Thus, it will be noted that the conventional hydrogenated amorphous silicon film containing the impurity for controlling the resistivity has a disadvantage of causing a substantial variation in properties such as an increase in resistivity of the film or the like due to the structural defects due to application of heat to the film.

Also, the hydrogenated amorphous silicon film containing the impurity for controlling resistivity of the film is often used as a resistive element on a cathode conductor side of a field emission type fluorescent display device wherein a field emission cathode is used as an electron source therefor. Unfortunately, the hydrogenated amorphous silicon film, as described above, exhibits thermal instability, so that use of the film as the resistive element for the field emission type fluorescent display device causes the film to be subject to restrictions on various conditions for a heat treatment carried out during manufacturing of the device.

Thus, the hydrogenated amorphous silicon film containing the impurity for controlling resistivity of the film which is produced according to the conventional techniques fails to provide a resistive element which permits a field emission type fluorescent display device to be stably operated, while ensuring satisfactory stability and reproducibility in production of the element.

SUMMARY OF THE INVENTION

The present invention has been made in view of the foregoing disadvantage of the prior art.

Accordingly, it is an object of the present invention to provide a resistive element made of a hydrogenated amorphous silicon film containing an impurity for controlling resistivity of the film which is capable of permitting resistivity thereof to exhibit satisfactory thermal stability against a heat treatment.

It is another object of the present invention to provide a method for producing a resistive element capable of exhibiting such excellent properties as described above.

It is a further object of the present invention to provide an apparatus for producing a resistive element capable of exhibiting such excellent properties as described above.

In accordance with one aspect of the present invention, a resistive element made of a hydrogenated amorphous silicon film containing an impurity for controlling resistivity of the film is provided. In the resistive element, the hydrogenated amorphous silicon film contains nitrogen for thermally stabling the resistive element.

In a preferred embodiment of the present invention, the nitrogen for thermally stabilizing the resistive element is prepared from a nitrogen bearing compound selected from the group consisting of dinitrogen, ammonia and nitrous oxide.

In a preferred embodiment of the present invention, the nitrogen is prepared from dinitrogen, which is contained in an amount of 50% or more in a starting gas material.

In accordance with another aspect of the present invention, a method for producing a resistive element is provided. The method comprises the step of depositing a hydrogenated amorphous silicon film containing an impurity for controlling resistivity of the film on a substrate, during which a nitrogen bearing gas is added for thermally stabilizing the resistive element.

In a preferred embodiment of the method of the present invention, the nitrogen bearing gas for thermally stabilizing the resistive element is selected from the group consisting of dinitrogen, ammonia and nitrous oxide.

In a preferred embodiment of the method of the present invention, nitrogen bearing of the nitride gas is contained in an amount of 50% or more in a starting gas material.

In a preferred embodiment of the method of the present invention, a temperature of the substrate is controlled to be between 250° C. and 430° C. during deposition of the hydrogenated amorphous silicon film, resulting in resistivity of the hydrogenated amorphous silicon film deposited being controlled to be between $3\times10^6$ Ωcm and $7\times10^2$ Ωcm.

In accordance with a further aspect of the present invention, an apparatus for depositing a hydrogenated amorphous silicon film containing an impurity for controlling resistivity of the film on a substrate is provided. The apparatus includes at least one pair of discharge electrodes and a means for feeding the discharge electrodes with a starting gas material for forming the hydrogenated amorphous silicon film and a nitrogen bearing gas for thermally stabilizing the resistive element, respectively.

In a preferred embodiment of the apparatus of the present invention, the apparatus also includes a means for carrying out temperature control during deposition of the hydrogenated amorphous silicon film to control resistivity of the hydrogenated amorphous silicon film during the deposition.

In each of the resistive element and method according to the present invention constructed as described above, nitrogen for thermally stabilizing the resistive element is contained in the starting gas material, so that resistivity of the resistive element may be maintained stable against a heat treatment of the resistive element. Also, the apparatus of the present invention constructed as described above permits the hydrogenated amorphous silicon film containing nitrogen sufficient to thermally stabilize the resistive element to be produced.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, the present invention will be described hereinafter with reference to the accompanying drawings.

First, a plasma CVD apparatus which may be applied to the present invention will be described with reference to FIG. 1.

Figure 1:
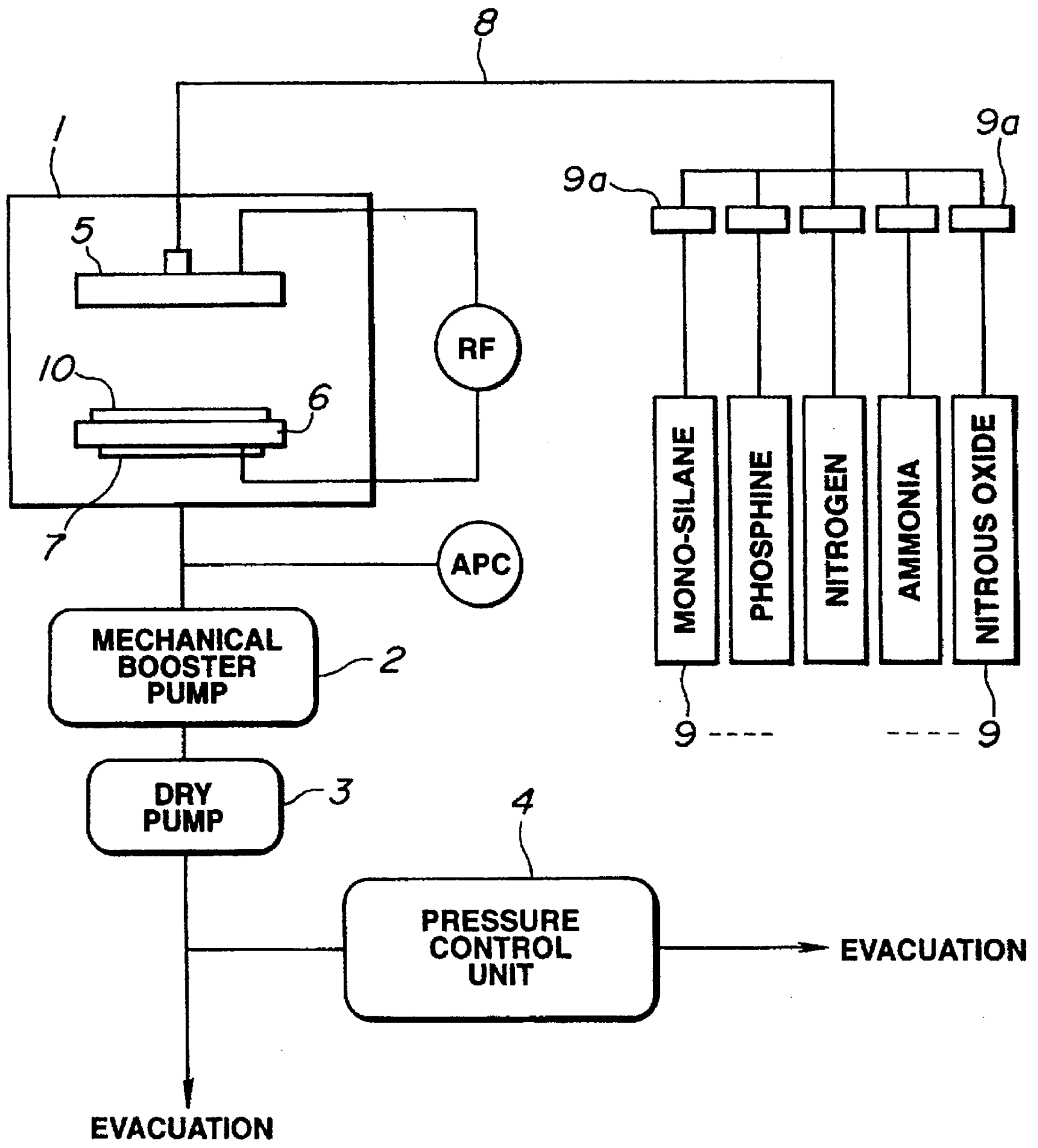
FIG. 1 is a block diagram generally showing one example of a plasma CVD apparatus which may be applied to an embodiment of a method for manufacturing a resistive element according to the present invention.

The plasma CVD apparatus, as shown in FIG. 1, includes a reaction chamber 1 airtightly constructed, which is externally evacuated through a mechanical booster pump 2 and a dry pump 3, resulting in an interior thereof being kept at a pressure as low as about 0.6 to 1.0 Torr during processing. During the evacuation, a part of air in the reaction chamber 1 is outwardly discharged therefrom through a pressure control unit 4 and a pressure in the reaction chamber 1 is controlled by means of a pressure controller APC.

The reaction chamber 1 is provided therein with an upper electrode or so-called shower electrode 5 and a lower electrode 6. Between the upper electrode 5 and the lower electrode 6 is electrically connected a radiofrequency power supply RF.

The lower electrode 6 is mounted on a lower surface thereof with a heater 7 and on an upper surface thereof with a substrate 10, on which a hydrogenated amorphous silicon film is formed as described hereinafter. Operation and control of the heater 7 permit the substrate 10 to be heated to and kept at a predetermined temperature. The substrate 10 may be made of a glass plate free of any alkali material.

The upper electrode 5 is connected to one end of a piping 8 while ensuring airtightness of the reaction chamber 1. The piping 8 is ramifiedly connected at the other end thereof through a plurality of flow control valves 9*a* to a plurality of vessels 9 in which a plurality of gas components for a starting gas material or reaction gas material are stored, respectively, so that selective flow control by the flow control valves 9*a* may permit the components of the starting gas material to be selectively fed in predetermined amounts to the reaction chamber 1.

Now, an example of a method for production of a hydrogenated amorphous silicon film containing an impurity for controlling resistivity of the film according to the present invention which was carried out using the plasma CVD apparatus constructed as described above will be described hereinafter.

A starting gas material consisting of three components, mono-silane ($SiH_4$), phosphine ($PH_3$) and a nitrogen bearing gas for thermally stabilizing a resistive element to be produced was used in the example. The phosphine was used in the form of gas diluted to 1% in concentration by dinitrogen.

In the example, first of all, the substrate 10 was put on the lower electrode 6 arranged in the reaction chamber 1. Then, the reaction chamber 1 was evacuated to a pressure of about 0.6 to 1.0 Torr and then the heater 7 was operated to heat the substrate 10 to a temperature of 200° to 300° C. Subsequently, the starting gas material was introduced into the reaction chamber 1 while keeping the substrate 10 at the above-described temperature. A voltage of a predetermined high frequency was applied between the upper electrode 5 and the lower electrode 6 to cause RF discharge, resulting in the starting gas material being decomposed, leading to deposition of the decomposed starting gas material on the substrate 10.

More particularly, a hydrogenated amorphous silicon film was deposited on each of the substrates 10 while setting a ratio of dinitrogen gas to the sum total amount of mono-silane and phosphine at each of 0% (corres. to the prior art), 25%, 50%, 75% and 100%. Dinitrogen gas was used as the nitrogen bearing gas. The deposition was carried out at a rate of about 0.1 μm/min, resulting in the film being formed into a thickness of about 0.5 μm.

Thereafter, resistivity of each of the hydrogenated amorphous silicon films respectively deposited under the above-described conditions was measured. Also, two samples of each of the hydrogenated amorphous silicon films thus deposited were subject to annealing under conditions different from each other, respectively, and then subject to measurement of resistivity, wherein one annealing treatment or a first annealing treatment was carried out at 450° C. for 1 hour and the other annealing treatment or a second annealing treatment was carried out at 550° C. for 1 hour.

Figure 2:
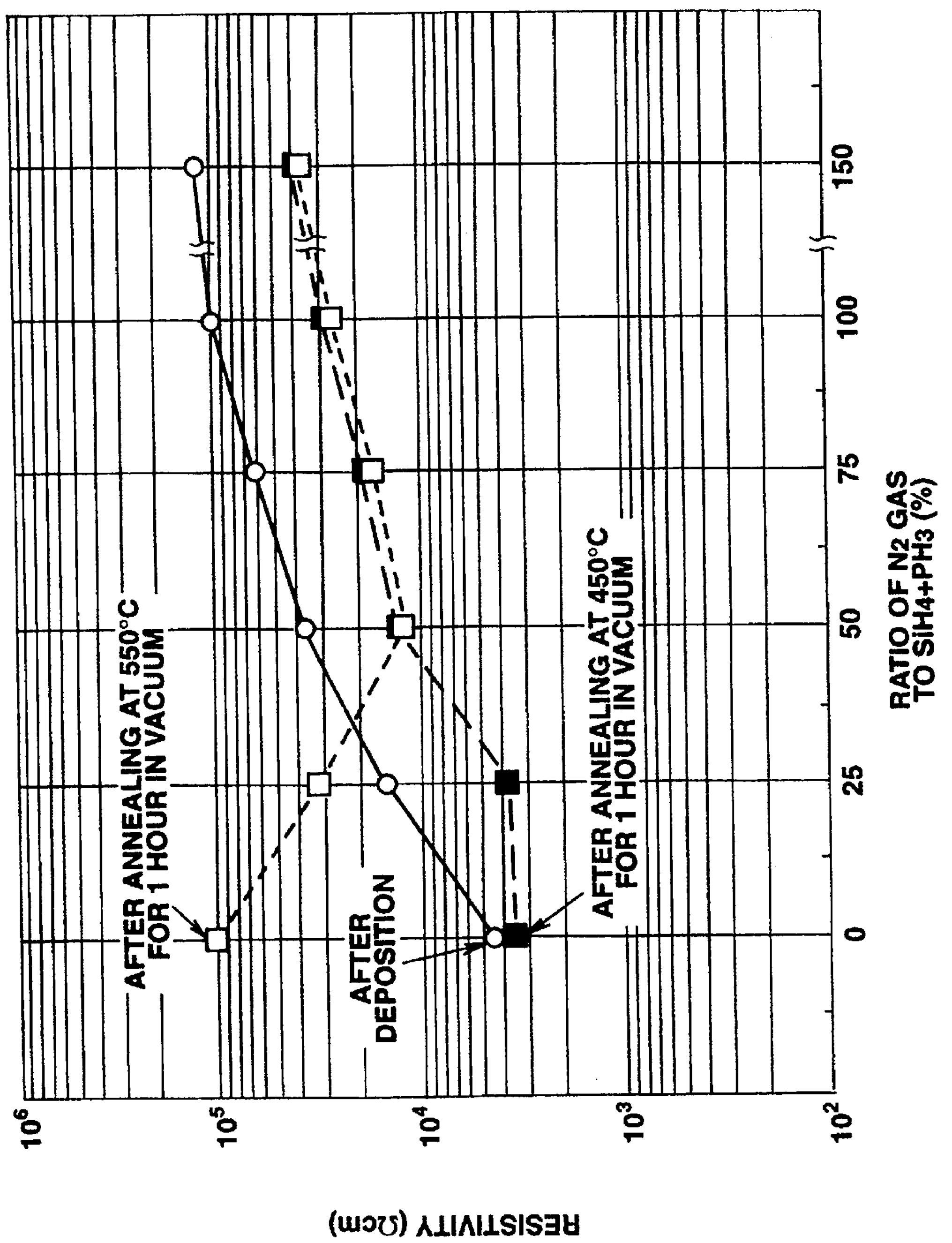
FIG. 2 is a graphical representation showing relationship between a ratio of nitrogen gas to the sum total amount of mono-silane and phosphine and resistivity of a hydrogenated amorphous silicon film formed.

FIG. 2 shows relationship between a ratio of the dinitrogen gas to the sum total amount of mono-silane and phosphine and resistivity of each of the thus-formed hydrogenated amorphous silicon films. The two samples of each of the hydrogenated amorphous silicon films were subject to the annealing treatment under the above-described conditions, respectively.

As will be noted from FIG. 2, the hydrogenated amorphous silicon film containing an impurity for controlling resistivity of the film is increased in resistivity with an increase in content of nitrogen in the starting gas material.

Also, FIG. 2 indicates that annealing of the hydrogenated amorphous silicon film carried out at 450° C. for 1 hour causes a reduction in resistivity of the hydrogenated amorphous silicon film. In particular, when a ratio of the dinitrogen gas to the sum total amount of mono-silane and phosphine is 25% or more, a degree at which the resistivity is decreased is caused to be substantially constant. Such a decrease in resistivity of the hydrogenated amorphous silicon film by the annealing treatment would be considered due to the fact that a network of a crystal of the film which was rendered incomplete during deposition of the film is rearranged due to heat applied thereto, resulting in structural defects of the network being released.

Further, FIG. 2 indicates that annealing of the hydrogenated amorphous silicon film carried out at 550° C. for 1 hour causes an increase in resistivity of the film, when a ratio of dinitrogen gas to the sum total amount of mono-silane and phosphine is as low as 0% or 25% or less. On the contrary, the annealing under the conditions that the ratio is 50% or more permitted the film to exhibit substantially the same resistivity as in the above-described annealing at 450° C. for 1 hour.

Thus, it will be noted that the nitrogen ratio of 50% or more causes the resistivity after the annealing to be reduced by a constant value irrespective of the nitrogen ratio and heat treatment conditions.

Also, resistivity of the hydrogenated amorphous silicon film containing the impurity for controlling resistivity of the film prior to the heat treatment is varied depending on a temperature during deposition of the film as well.

Figure 3:
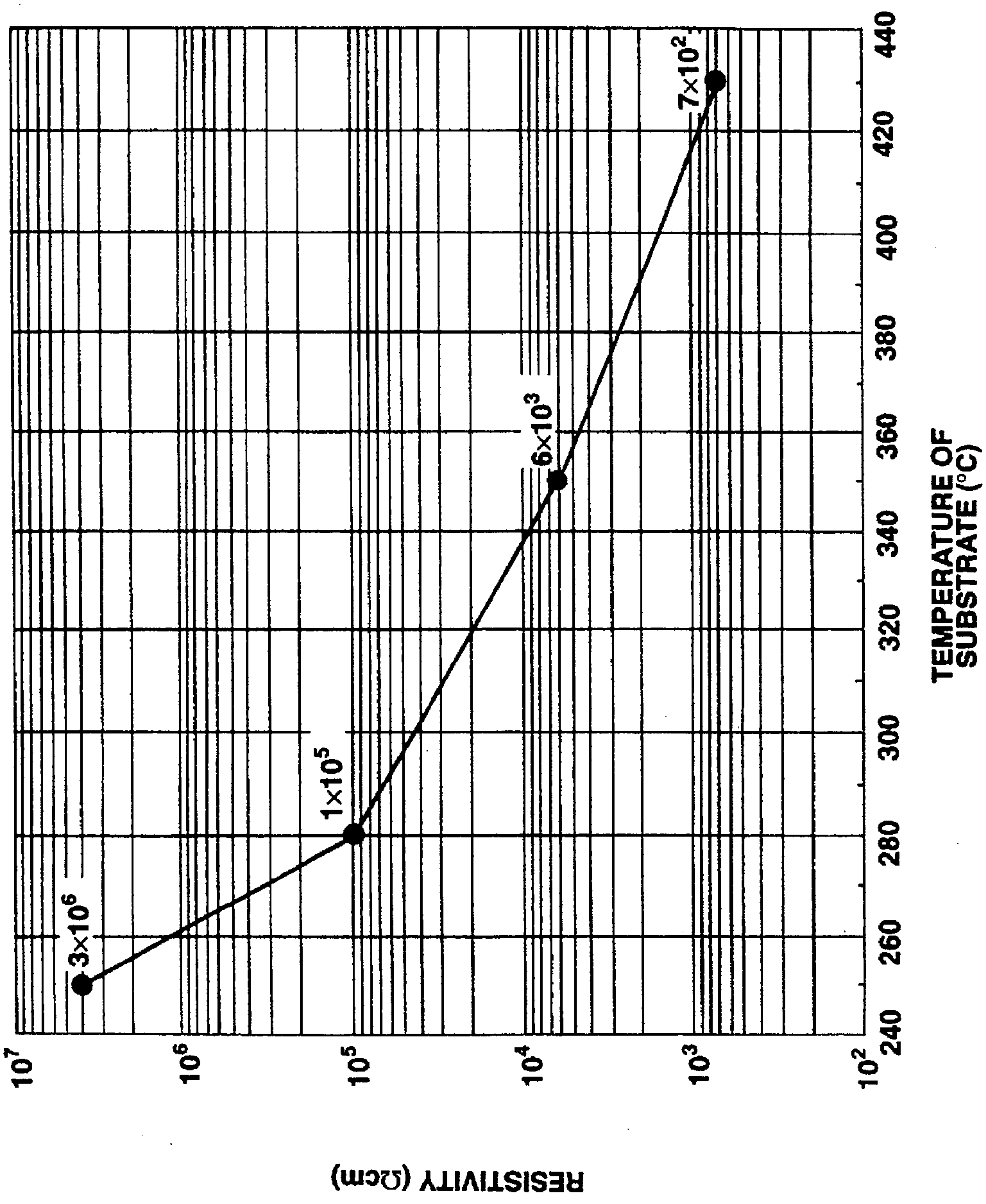
FIG. 3 is a graphical representation showing a variation in resistivity of a hydrogenated amorphous silicon with a change in temperature of a substrate during deposition of hydrogenated amorphous silicon free of nitrogen.

FIG. 3 shows resistivity of the hydrogenated amorphous silicon film free of nitrogen obtained when a temperature of the substrate is set at each of 250° C., 280° C., 350° C. and 430° C. during deposition of the film. FIG. 3 indicates that the resistivity is decreased with an increase in temperature of the substrate during the deposition.

Thus, it will be noted that the experimental results described above indicate that any selective combination between a temperature of the substrate during deposition of the film and the nitrogen ratio permits the hydrogenated amorphous silicon film exhibiting satisfactory thermal stability or, in the illustrated embodiment, the hydrogenated amorphous silicon film containing the impurity for controlling resistivity of the film to be deposited on the substrate.

Now, a field emission cathode of a field emission type fluorescent display device in which the hydrogenated amorphous silicon film containing the impurity for controlling resistivity of the film obtained in the above-described example is used as a resistive layer will be described together with the field emission type fluorescent display device with reference to FIG. 4.

Figure 4:
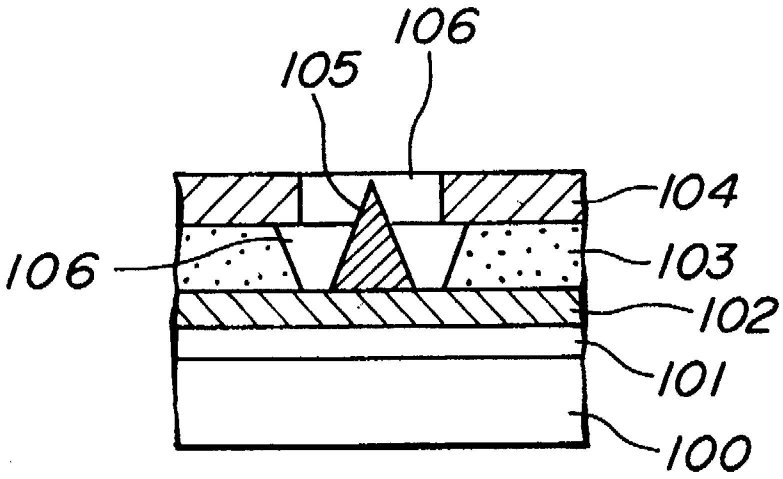
FIG. 4 is a fragmentary sectional view schematically showing an essential part of a field emission type fluorescent display device in which a hydrogenated amorphous silicon film produced according to a method of the present invention is incorporated in the form of a resistive layer.

The field emission cathode shown in FIG. 4 includes a cathode conductive layer 101 and a resistive layer 102 made of the hydrogenated amorphous silicon film containing the impurity for controlling resistivity of the resistive layer 102, which are formed on a substrate 100 of the field emission type fluorescent display device in order. The resistive layer 102 is formed thereon through an insulating layer 103 with a gate 104. The insulating layer 103 and gate 104 are formed with through-holes 106 in a manner to be common to both. The through-holes 106 each are provided therein with an emitter of a conical shape while being arranged on the resistive layer 102.

The field emission type fluorescent display device also includes in addition to the field emission cathode constructed as described above, a light-permeable front cover (not shown) arranged opposite to a surface of the substrate 100 on which the field emission cathode is arranged in a manner to be known in the art. The front cover is provided on an inner surface thereof with an anode structure acting as a luminous displays section, which includes a light-permeable anode conductor and phosphor layers deposited on the anode conductor.

In the field emission type fluorescent display device constructed as described above, electrons emitted from the field emission cathode are caused to selectively impinge on the phosphor layers of the anode structure, resulting in the phosphor layers emitting light, which is then externally observed through the light-permeable anode conductor and front cover.

The field emission type fluorescent display device thus constructed, as described above, includes the resistive layer 102 arranged between the cathode conductive layer 101 and the emitter 105. Such construction, even when short-circuiting occurs for any reason, prevents an excessive amount of current from flowing to the emitter 105. Also, this, even when the short-circuiting causes breakage of the emitter 105, minimizes the breakage.

In manufacturing of the field emission type fluorescent display device constructed as described above, a heating treatment is carried out in various steps such as a step of sealing an envelope, a step of calcining the substrate of the fluorescent display device and the like. In each of the steps, the heat treatment is required to be carried out at a temperature of about 300° C. or more.

However, use of the hydrogenated amorphous silicon film containing the impurity for controlling resistivity of the film as the resistive element in the present invention permits the field emission type fluorescent display device to exhibit stable display performance, because the film exhibits thermally stable resistivity as described above.

In the example described above, plasma CVD is used for formation of the hydrogenated amorphous silicon film containing the impurity for controlling resistivity of the film. Alternatively, resistive sputtering may be substituted for the plasma CVD.

Application of resistive sputtering to formation of the hydrogenated amorphous silicon film containing the impurity for controlling the resistivity by deposition is carried out by incorporating a suitable amount of a nitrogen bearing gas such as, for example, dinitrogen gas, for rendering the resistive element thermally stable into the starting gas material, resulting in providing a hydrogenated amorphous silicon film containing an impurity for controlling resistivity of the film which exhibits substantially the same function and advantage as that provided by plasma CVD.

Also, in the resistive sputtering, the nitrogen bearing gas may be added to the starting gas material in the course of deposition of the hydrogenated amorphous film containing the impurity for controlling the resistivity. Alternatively, it may be incorporated, by ion implantation or the like, in the hydrogenated amorphous silicon film having been deposited. In this instance, it may be ion-implanted at density of $10^{18}$ to $10^{20}$ $cm^{-3}$.

As can be seen from the foregoing, the present invention permits resistivity of the hydrogenated amorphous silicon film containing the impurity for controlling the resistivity to be kept thermally stable against a heat treatment of the film. Also, the hydrogenated amorphous silicon film of the present invention exhibits increased reliability against heat externally applied thereto. Therefore, the resistive element made of the hydrogenated amorphous silicon film, when it is incorporated in an electric circuit and particularly a semiconductor electric circuit, likewise exhibits high reliability against heat generated by the circuit.

In general, an amorphous silicon film of this type is relatively increased in internal stress, resulting in being often peeled from the substrate on Which it is deposited. However, in the present invention, control of a ratio of a nitrogen bearing gas for thermally stabilizing the hydrogenated amorphous silicon film during deposition of the film to a mixture of mono-silane and phosphine permits internal stress of the hydrogenated amorphous silicon film to be satisfactorily and readily controlled.

Further, in the present invention, a nitrogen bearing gas for rendering the resistive element thermally stable is incorporated in the starting gas material, unlike the prior art. This causes the starting gas material to be increased in amount, to thereby ensure stable discharge during deposition of the film. This results in the hydrogenated amorphous silicon film deposited exhibiting stable characteristics.

While a preferred embodiment of the present invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method, comprising:

depositing hydrogenated amorphous silicon on a substrate using a starting material gas comprising 50% or more of a nitrogen bearing gas;

wherein said hydrogenated amorphous silicon comprises nitrogen and an impurity for controlling the resistivity of said hydrogenated amorphous silicon so that said hydrogenated amorphous silicon, has a resistivity of $7\times10^2$ to $3\times10^6$ Ωcm.

2. The method of claim 1, wherein said nitrogen bearing gas is selected from the group consisting of dinitrogen, ammonia and nitrous oxide.

3. The method of claim 2, wherein said nitrogen bearing gas is dinitrogen.

4. The method of claim 1, wherein said substrate is at a temperature of 250°–430° C. during said depositing.

5. The method of claim 1, further comprising forming a cathode conductive layer on said substrate, prior to depositing said hydrogenated amorphous silicon.

6. The method of claim 5, further comprising forming (i) an insulating layer, (ii) a gate and (iii) an emitter on said substrate, thereby preparing a field emission cathode.

7. The method of claim 1, wherein said hydrogenated amorphous silicon has a resistivity after annealing said hydrogenated amorphous silicon at 550° C. for one hour which is substantially the same as a resistivity of said hydrogenated amorphous silicon after annealing said hydrogenated amorphous silicon at 450° C. for one hour.

8. The method of claim 1, wherein said depositing is carried out with a starting material gas comprising 50% or more of a nitrogen bearing gas selected from the group consisting of dinitrogen, ammonia and nitrous oxide, and said substrate is at a temperature of 250°–430° C. during said depositing.

9. A method, comprising depositing hydrogenated amorphous silicon on a substrate using a starting material gas comprising 50% or more of a nitrogen bearing gas;

wherein said hydrogenated amorphous silicon comprises nitrogen and an impurity for controlling the resistivity of said hydrogenated amorphous silicon so that hydrogenated amorphous silicon has a resistivity of $7\times10^2$ to $3\times10^6$ Ωcm, and said hydrogenated amorphous silicon has a resistivity after annealing said hydrogenated amorphous silicon at 550° C. for one hour which is substantially the same as a resistivity of said hydrogenated amorphous silicon after annealing said hydrogenated amorphous silicon at 450° C. for one hour.

10. The method of claim 9, wherein said nitrogen bearing gas is selected from the group consisting of dinitrogen, ammonia and nitrous oxide.

11. The method of claim 10, wherein said nitrogen bearing gas is dinitrogen.

12. The method of claim 9, wherein said substrate is at a temperature of 250°–430° C. during said depositing.

13. The method of claim 9, further comprising forming a cathode conductive layer on said substrate, prior to depositing said hydrogenated amorphous silicon.

14. The method of claim 13, further comprising forming (i) an insulating layer, (ii) a gate and (iii) an emitter on said substrate, thereby preparing a field emission cathode.

* * * * *